(12) United States Patent
Hasegawa et al.

(10) Patent No.: US 6,600,797 B1
(45) Date of Patent: Jul. 29, 2003

(54) PHASE FREQUENCY SYNCHRONISM CIRCUIT AND OPTICAL RECEIVER

(75) Inventors: Atsushi Hasegawa, Yokohama (JP); Tetsuya Aoki, Yokohama (JP); Takeshi Yamashita, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/517,942

(22) Filed: Mar. 3, 2000

(30) Foreign Application Priority Data

Dec. 17, 1999 (JP) .......................................... 11-358531

(51) Int. Cl.$^7$ ................................................. H03D 3/24
(52) U.S. Cl. ........................... 375/376; 327/156; 331/11
(58) Field of Search .................................. 375/375, 376; 327/147, 149, 150, 152, 156, 158, 159; 331/1 R, 14, 18, 25, 1 A, 10, 11

(56) References Cited

U.S. PATENT DOCUMENTS

| 4,682,116 A | * | 7/1987 | Wolaver et al. ................. 327/5 |
| 4,736,243 A | * | 4/1988 | Takanashi et al. .......... 348/288 |
| 4,942,370 A | * | 7/1990 | Shigemori ................... 331/1 A |

FOREIGN PATENT DOCUMENTS

| JP | 05020679 | 1/1993 |
| JP | 08098022 | 4/1996 |

OTHER PUBLICATIONS

TP10.3:8Gb/s Si Bipolar Phase and Frequency Detector IC for Clock Extraction.

* cited by examiner

*Primary Examiner*—Don N. Vo
(74) *Attorney, Agent, or Firm*—Townsend and Townsend and Crew LLP

(57) ABSTRACT

In order to solve the problem that since a loop filter constant suitable for asynchronous state cannot be selected in the conventional phase frequency synchronism circuit, it takes a long time to synchronize the input data and the clock signal from the asynchronous state, the present invention is to propose a phase frequency synchronism circuit including a phase comparator for generating a voltage according to the phase difference of the clock signal to the input signal, a frequency comparator for deciding if the frequency of the clock signal is higher or lower than the transmission rate of the input signal and generating a binary signal, a synchronous identifying unit for deciding if the input signal and the clock signal are synchronized in their phases and frequencies, a first switch that receives the output from the phase comparator and is closed and opened when the synchronous identifying unit decides that they are synchronized and not synchronized, respectively, a second switch that receives the output from the frequency comparator and is opened and closed when the synchronous identifying unit decides that they are synchronized and not synchronized, respectively, a loop filter that receives the outputs from the first and second switches, and a voltage controlled oscillator that oscillates on the basis of the output from the loop filter.

17 Claims, 8 Drawing Sheets

PHASE FREQUENCY SYNCHRONISM CIRCUIT AND OPTICAL RECEIVER

BACKGROUND OF THE INVENTION

The present invention generally relates to an optical transmission system, and particularly to a phase synchronism circuit for use in optical fiber transmission.

In the optical transmission system, a photodetector photoelectrically converts a received optical signal to an electrical signal. The NRZ coded binary data produced after this converted electrical signal is equalized, amplified and digitized has small jitter when the received optical level is large, but increases the jitter as the received optical level decreases. When no optical signal is detected, noise output is produced which corresponds to infinite jitter. In addition, a pulse width distortion is caused in this data by optical transmission and receiving circuits.

FIG. 1 shows the construction of a related phase frequency synchronism circuit that generates from such data signal a clock signal synchronized with that data. Referring to FIG. 1, there is shown a phase comparator 10 that generates a pulse voltage of a peak value or pulse width corresponding to the phase difference between the input data and the clock signal. A frequency comparator 20 produces the difference of the frequency of the clock signal to the transmission rate of the input data. When the input data and the clock signal are synchronized to within a predetermined phase difference, no frequency difference is produced. The output from the phase comparator 10 and the output from the frequency comparator 20 are supplied through an overlap unit 80 to a loop filter 40. A VCO (voltage controlled oscillator, hereinafter referred to as VCO) 50 generates the clock signal with the oscillation frequency changed on the basis of the output from the loop filter 40, and feeds it back in order that the input data and the clock signal can be synchronized with each other. The phase frequency synchronism circuit of this construction is described in, for example, "TP10.3:A 8 Gb/s Si Bipolar Phase and Frequency Detector IC for Clock Extraction", 1992 IEEE International Solid-State Circuits Conference, p. 162, and JP-A-6-216766.

A storaging apparatus using disks has vibration of about 1% of the data rate because of irregular rotation of disks. As compared with the data signal from the optical receiver, the data signal from the filing apparatus has small jitter and pulse width distortion. FIG. 2 shows the construction of a related phase frequency synchronism circuit that generates from the data signal a clock signal synchronized with that data. Referring to FIG. 2, there is shown a first phase comparator 10-1 that generates a pulse voltage of a pulse with corresponding to the phase difference between the input data and the clock signal. A rate (frequency) comparator 600 compares the input data and the clock signal to detect if the clock signal exceeds a specified limit of the mark length of the data, and produces the decision output of if the bit rate (frequency) of the clock is higher or lower than that of the data.

A second phase comparator 10-2 generates a pulse voltage of a pulse width corresponding to the leading or lagging phase difference between the input data and the clock signal. The second phase comparator 10-2 receives the input data, the clock signal and the output from the rate comparator 600 and generates the pulse voltage of the pulse width corresponding to either leading or lagging phase difference between the input data and the clock signal according to the output from the rate comparator 600. A synchronous identifying unit 30 compares the input data and the clock signal to detect if the clock signal exceeds a specified limit of the mark length of the data, thus deciding if the input data and the clock signal are synchronized. A switch 1 is provided between the output of the first phase comparator 10-1 and a first loop filter 40-1 and operated to close or open when the synchronous identifying unit 30 decides that those signals are synchronized or not synchronized, respectively. A switch 2 is placed between the output of the second phase comparator 10-2 and a second loop filter 40-2 and operated to open or close when the synchronous identifying unit 30 decides that those signals are synchronized or not synchronized, respectively. The outputs from the first and second loop filters 40-1, 40-2 are supplied through an adder 90 to the VCO 50. The VCO 50 produces the clock signal with its oscillation frequency changed in accordance with the output from the adder 90, and feeds it back in order that the input data and the clock signal can be synchronized. The phase frequency synchronism circuit of this construction is described in JP-A-9-284269.

In the phase frequency synchronism circuit shown in FIG. 1, the loop filter constant is determined by the characteristic of the loop of the phase comparator 10, loop filter 40 and VCO 50 when the input data and the clock signal are synchronized. A loop of the frequency comparator 20, loop filter 40 and VCO 50 is used when the input data and the clock are not synchronized. Since the loop filter constant for the asynchronous state cannot be selected, there is a problem that it takes a long time to reach the synchronous state from the asynchronous state.

Let us consider that in the phase frequency synchronism circuit shown in FIG. 2, the frequencies of the input data and clock signal become close to each other from the asynchronous state in which the switches 1 and 2 are respectively opened and closed, resulting in the generation of a "synchronous" deciding signal from the synchronous identifying unit 30. The generation of the "synchronous" deciding signal means that the output from the adder 90, or the sum of the output from the first loop filter 40-1 and the output from the second loop filter 40-2 approaches a predetermined value relative to the oscillation frequency of the VCO 50. It is supposed from this situation that there is a voltage level difference between the output from the first phase comparator 10-1 and the output from the first loop filter 40-1. When the switches 1 and 2 are closed and opened, respectively, there is a possibility that the output from the adder 90 suddenly changes due to the voltage level difference between the output of the first phase comparator 10-1 and the output of the first loop filter 40-1, making the phase frequency synchronism circuit unstable. Therefore, although the phase frequency synchronism circuit of FIG. 2 having the two loop filters is able to separately set the frequency pull-in characteristic and phase pull-in characteristic, it may become unstable when switching is made from the frequency pull-in mode to the phase pull-in mode.

In addition, let us consider that the phase frequency synchronism circuit of FIG. 1 receives binary data with large jitter resulting from equalizing, amplifying and digitizing a faint optical signal. Even when the synchronism circuit shown in FIG. 1 achieves that the input data and the clock signal are synchronous in their phases, the input jitter may instantaneously exceed a certain phase difference to cause the frequency comparator 10 to be operative so that the clock jitter increases in an instant. In the phase frequency synchronism circuit of FIG. 2, when the input jitter instantaneously exceeds a predetermined phase difference, the synchronous identifying unit 30 may decide by mistake that the input data and the clock signal are asynchronous by mistake. As a result, switching is made from the phase synchronous mode to the frequency synchronous mode so that the clock jitter increases. If a phase frequency synchronism circuit having a characteristic to increase jitter in the clock signal is used in the optical receiver, the error rate may suddenly increase.

In addition, when the input data is generally NRZ coded and has pulse width distortion, a phase comparator that generates a voltage of a peak value or pulse width corresponding to the phase difference of the clock signal relative to both leading and trailing edges of the input data will randomly generate a pulse voltage of the different peak values or pulse widths. In the phase comparator mode loop structure formed of a phase comparator, filter and VCO, when a pulse voltage of two different peak values or pulse widths is produced randomly, the random component of the phase comparator output within the loop band causes the clock jitter to increase. In the loop structure formed of a frequency comparator, filter and VCO, when the phase comparator randomly generates a pulse voltage of two different peak values or pulse widths, the intervals at which the frequency comparing decision is made are not integral multiples as wide as the input data width, resulting in low precision with which the frequency comparing decision is made. When the frequency synchronizing mode cannot make frequency pull-in operation up to the frequency to which the phase synchronizing mode can make pull-in operation, the phase frequency synchronism circuit may make erroneous synchronization operation.

SUMMARY OF THE INVENTION

Accordingly, it is an object of the invention to provide a phase frequency synchronism circuit having a phase synchronizing loop formed of a phase comparator, filter and VCO for the synchronous state and a frequency synchronizing loop formed of a frequency comparator, filter and VCO for the asynchronous state, and capable of reducing the time taken for the input data and the clock signal to become synchronous from the asynchronous state without unstable operation when switching is made from the frequency synchronizing loop to the phase synchronizing loop.

It is another object of the invention to provide a phase frequency synchronism circuit normally capable of making synchronous operation by the phase comparison mode, and capable of preventing the clock jitter from instantaneously increasing in order that, when the input data has jitter that instantaneously exceeds a certain phase difference, a synchronous identifying unit decides that the input data and the clock are synchronous, causing the output of the frequency comparator not to be transmitted to the loop filter and the phase comparison mode to be used for the synchronizing operation even if the input jitter increases to make the frequency comparator instantaneously operative.

It is still another object of the invention to provide a phase frequency synchronism circuit capable of preventing jitter due to the random component of NRZ code when the input data is NRZ coded and has pulse width distortion, and capable of making the intervals at which the frequency comparator compares an integral multiple as wide as the width of the input data when the input data is NRZ coded and has pulse width distortion, thus preventing the precision of the frequency comparator from being reduced.

In order to solve the above problem, according to the present invention, there is provided a phase frequency synchronism circuit including a phase comparator that receives input data and a clock signal and generates a voltage of a peak value or pulse width according to the phase difference of the clock signal to the input data, a frequency comparator that receives the input data and the clock signal and generates an output resulting from deciding if the frequency of the clock signal is higher or lower than the transmission rate of the input data, a synchronous identifying unit that receives the input data and the clock signal and decides if the input signal and the clock signal are synchronized in their phases and frequencies, a switch 1 that receives the output from the phase comparator and is closed and opened when the synchronous identifying unit decides that they are synchronized and not synchronized, respectively, a switch 2 that receives the output from the frequency comparator and is opened and closed when the synchronous identifying unit decides that they are synchronized and not synchronized, respectively, a loop filter that receives the outputs from the switches 1, 2, and a voltage controlled oscillator that generates the clock signal with its frequency changed on the basis of the output from the loop filter.

DESCRIPTION OF THE EMBODIMENTS

Embodiments of the invention will be described with reference to the accompanying drawings.

Figure 1:
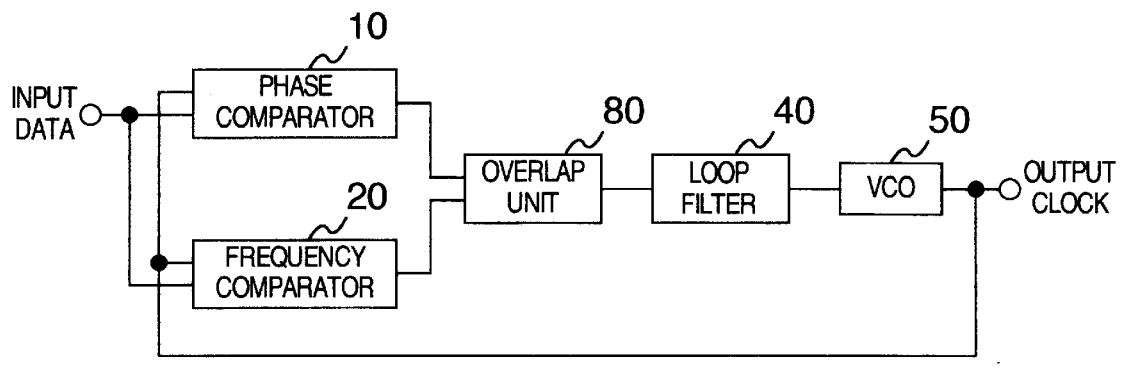
FIG. 1 is a block diagram of a related phase frequency synchronism circuit.
Figure 2:
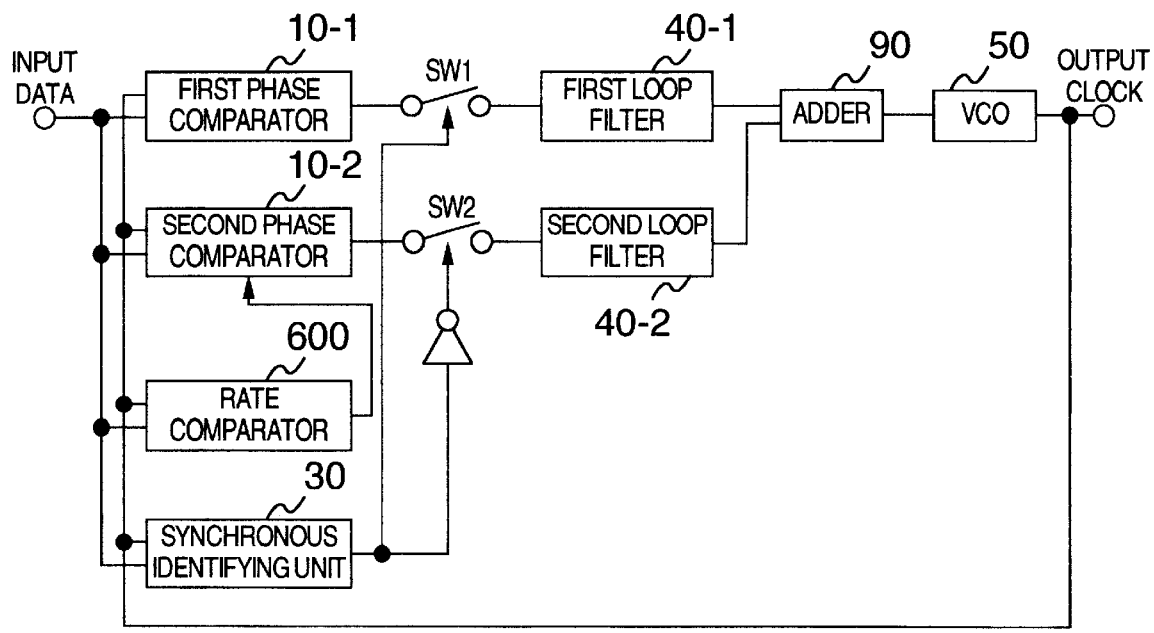
FIG. 2 is a block diagram of another related phase frequency synchronism circuit.
Figure 3:
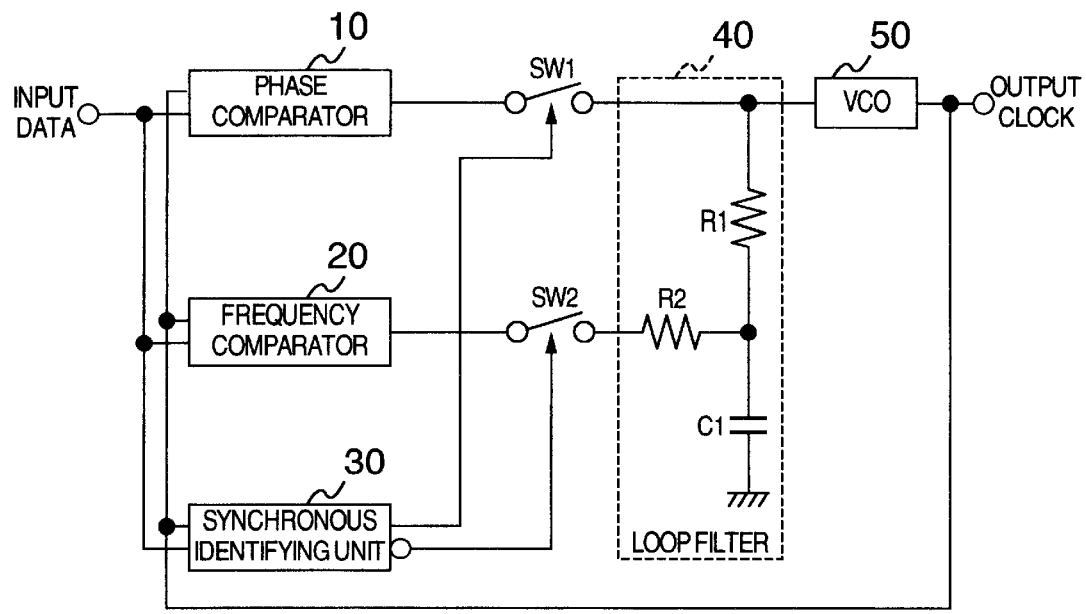
FIG. 3 is a block diagram of a phase frequency synchronous circuit according to the invention.

FIG. 3 shows an embodiment of a phase frequency synchronism circuit according to the invention.

The phase frequency synchronism circuit of the invention has the phase comparator 10, the frequency comparator 20, the synchronous identifying unit 30, the switches SW1, SW2, the loop filter 40 and the VCO 50. The phase comparator receives input data and a clock signal and produces a pulse voltage of a peak value or pulse width according to the phase difference of the clock signal to the input data. The frequency comparator 20 receives the input data and the clock signal and produces an output of deciding if the frequency of the clock signal is higher or lower than the transmission rate of the input data. The synchronous identifying unit 30 receives the input data and the clock signal and decides if those input data and clock signal are synchronized in phase and in frequency. The switch SW1 receives the output from the phase comparator 10 and operates to close when the synchronous identifying unit 30 decides that the input data and clock signal are synchronized or open when it decides they are not synchronized. The switch SW2 receives the output from the frequency comparator 20 and operates to open when the synchronous identifying unit 30 decides that those input data and clock signal are synchronized or close when it decides that they are not synchronized. The loop filter 40 receives the output signals from the switches SW1, SW2, and the VCO 50 generates the clock signal with its oscillation frequency changed according to the output signal from the loop filter 40.

The synchronous identifying unit 30 decides if the input data and the clock signal produced from the VCO 50 are synchronized. If it decides that those input data and clock signal are synchronized, the switches SW1 and SW2 are closed and opened, respectively to allow a loop to be constructed including the phase comparator 10, the loop filter 40 formed of a resistor R1 and a capacitor C1, and the VCO 50. If it decides that they are not synchronized, the switches SW1, SW2 are opened and closed, respectively to allow another loop to be constructed including the frequency comparator 20, the loop filter 40 formed of a resistor R2 and the capacitor C1, and the VCO 50. Even if the input jitter increases to operate the frequency comparator 20, the frequency comparator 20 is removed removed from the loop when the unit 30 decides that the input data and clock are synchronized, thus the clock jitter being prevented from increasing. When the input data and clock signal are not synchronized, the phase comparator 10 that makes unstable operation is excluded from the loop, and thus there is no error affecting on the synchronizing operation. In addition, since a loop filter characteristic for the asynchronous state can be realized by the resistor R2 while the filter characteristic for the synchronized state is maintained, it is possible to establish the optimum characteristics that can shorten the time necessary to synchronize from the asynchronous state.

Figure 4:
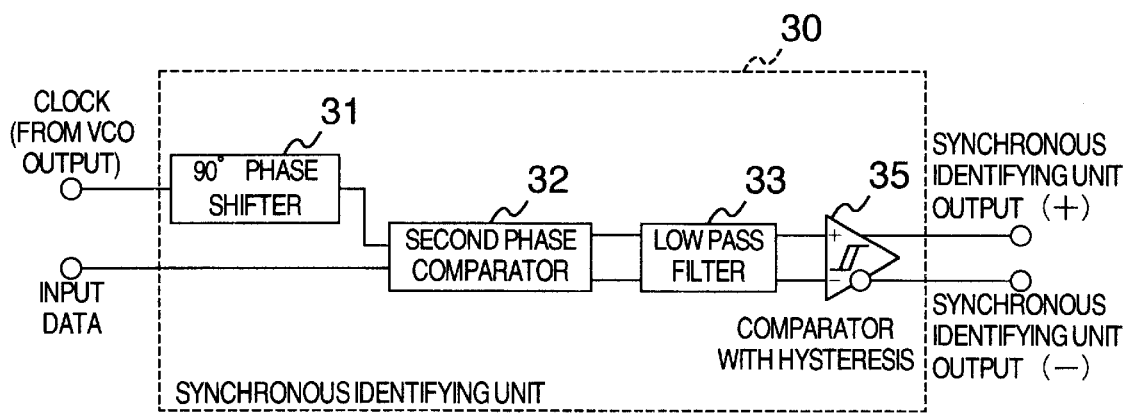
FIG. 4 is a block diagram of a synchronous identifying unit in the invention.

FIG. 4 shows an example of the synchronous identifying unit 30 in the invention.

The synchronous identifying unit 30 that is used in the invention has a 90° phase shifter 31, a second phase comparator 32, a low pass filter 33, and a comparator with hysteresis 35. The 90° phase shifter 31 shifts the clock signal by 90°. The second phase comparator 32 receives the input data and the output from the 90° phase shifter 31 and generates a high-level output when the phase difference of the clock signal to the input data is within the range of −90°~+90° or a low-level output when the phase difference of the clock signal to the input data is within the range of −180°~−90° or +90°~+180°. The low pass filter 33 receives the output from the second phase comparator 32 and makes filtering operation for a predetermined frequency band. The comparator with hysteresis 35 receives the output from the low pass filter 33 and has a threshold set between the high-level output and the middle point that lies between the high-level and low-level outputs produced from the second phase comparator 32.

The operation of the synchronous identifying unit 30 in the invention will be described in detail.

The second phase comparator 32 receives the input data and the clock signal with the phase 90° shifted that is produced from the phase shifter 31, and generates a voltage having a peak value corresponding to the phase difference of the phase-shifted clock signal to the input data. When the phase difference between the input data and the clock signal is 0, the second phase comparator 32 generates the maximum value (or the minimum value, hereinafter the case of the maximum value will be described). When the phase difference is not 0, The comparator 32 generates a beat signal of a frequency corresponding to the difference between the transmission rate of the input data and the frequency of the clock signal.

The output from the second phase comparator 32 is supplied through the low pass filter 33 to the comparator with hysteresis 35. The comparator 35 has set therein a threshold of approximately 0.75 level when the low level and high level of the output from the second phase comparator 32 are respectively 0 and 1. If the phase difference between the input data and the clock signal is so large as to produce the beat signal of which the frequency is higher than the frequency band of the low pass filter 33, the low pass filter produces a level of around 0.5. Thus, the comparator with hysteresis 35 generates an output of deciding that the input data and clock are asynchronous. When the frequency of the input data is coincident with that of the clock signal, the second phase comparator 32 generates a voltage of around the maximum value. The low pass filter 33 produces a level of about 1, and thus the comparator with hysteresis 35 generates an output of deciding that the input data and clock are being synchronized.

Use of low pass filter 33 makes it possible to suppress the instantaneous asynchronous signal produced from the second phase comparator 32 when the input data has large jitter. Thus, even if the jitter in the input data increases, it is possible to properly decide if the input data and the clock signal are synchronized.

The comparator with hysteresis 35 is able to prevent the output of deciding if the input data and clock are synchronized from being disturbed by the unstable operation of the low pass filter 33 when the clock signal transiently shifts from an asynchronous state to the synchronous state.

At this time, the synchronous identifying unit 30 decides that the input data and the clock signal are synchronized when the frequency difference between the transmission rate of the input data and the frequency of the clock signal is equal to or less than ftc multiplied by $\pi$ where ftc is the jitter transfer band that acts to transmit the jitter of the loop that is formed of the phase comparator 10, filter 40 and VCO 50 for the synchronous state. The phase pull-in loop formed of the phase comparator 10, filter 40 and VCO 50 controls the frequency difference between the transmission rate of the input data and the frequency of the clock signal to be decreased by narrowing the phase difference between the input data and the clock signal. If the amount of frequency shift of the clock signal is represented by f(t) and the initial value by Af, then the frequency shift f(t) of the phase pull-in loop can be expressed by the following equation (1).

$$f(t) = \Delta f^* \exp(-2\pi^* ftc^* t) \quad (1)$$

If the phase shift at t=0→∞ in the equation (1) is represented by Δθ, the phase shift Δθ can be given by the following equation (2).

$$\Delta\theta = \int 2\pi * f(t)dt \quad (2)$$

$$= 2\pi\Delta f * \int \exp(-2\pi * ftc * t)dt$$

$$= 2\pi\Delta f * \{-1/(2\pi * ftc)\} * [-2\pi * ftc * t]_0^\infty$$

$$= \Delta f / ftc$$

Considering that when Δθ becomes a few times as large as π, the phase comparator generates leading and lagging outputs several times so that the phase pull-in loop becomes unstable, Δθ=π is selected as the stabilization point of the phase pull-in loop.

Thus Δf=π*ftc. The phase pull-in loop stably operates when the frequency difference between the transmission rate of the input data and the frequency of the clock signal is equal to or less than ftc multiplied by π. During the process in which the input data and the clock signal are forced to shift from the asynchronous to synchronous state, the synchronous identifying unit 30 generates an output of deciding that the input data and clock are synchronized when the frequency difference between the transmission rate of the input data and the frequency of the clock signal is equal to or less than ftc multiplied by π. Thus, the phase pull-in loop is caused to stably make the frequency pull-in operation, thus preventing the synchronizing operation from being erroneous.

Figure 5:
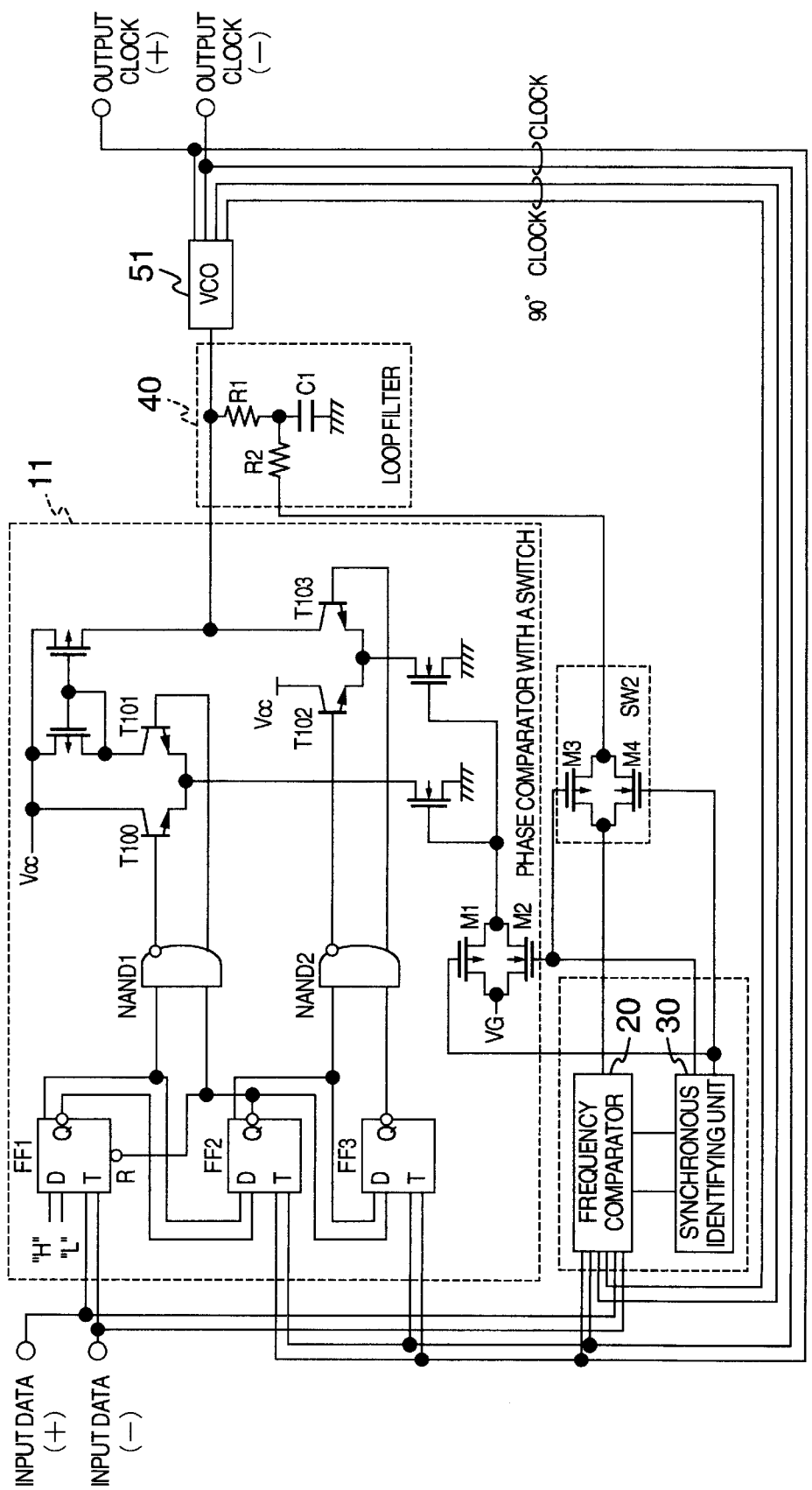
FIG. 5 is a detailed circuit block diagram of a phase frequency synchronism circuit according to claim 2 of the invention, with the frequency comparator and the synchronous identifying unit formed as a unitary body so that the clock signal 90° shifted is produced from the VCO without use of a 90 degree phase shifter.
Figure 6:
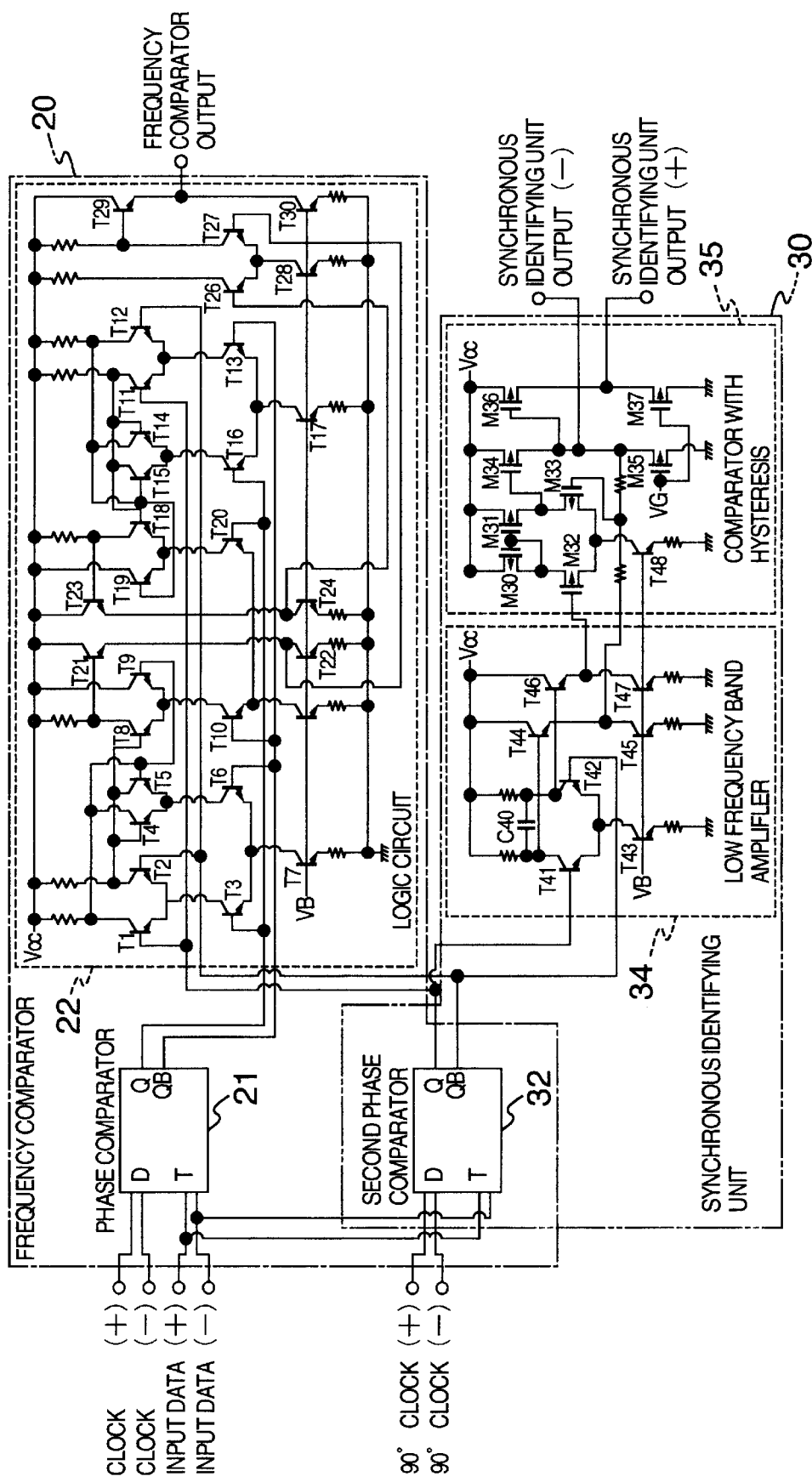
FIG. 6 is a detailed circuit diagram of the frequency comparator and synchronous identifying unit formed as a unitary body shown in FIG. 5.

FIG. 5 shows another embodiment of a phase frequency synchronism circuit according to the invention. FIG. 6 is a detailed circuit diagram of the frequency comparator 20 and synchronous identifying unit 30 illustrated in FIG. 5. A VCO 51, as illustrated in FIG. 5, generates differential outputs of clock signal and 90° shifted clock signal.

In a phase comparator with switch, 11 shown in FIG. 5, a NAND gate 1 generates a pulse voltage of which the width corresponds to the phase difference between the input data and the clock signal. Only when the NAND gate 1 generates the output, a NAND gate 2 generates a fixed pulse. The circuit formed of bipolar transistors T100 through T103 converts the voltage signals from the NAND gates 1, 2 into current signals. The width of the fixed pulse from the NAND gate 2 is so set that the average current output from the phase comparator with switch 11 is 0 when the input data and clock signal have the same phase. The MOS transistors M1, M2 serve to actuate the comparator 11 when they are supplied with the positive high-level outputs from the synchronous identifying unit 30 under the synchronized state and to stop the comparator 11 when they are supplied with the positive low-level outputs from the unit 30 under the asynchronous state. The output of the comparator 11 is connected to the resistor R1 of the loop filter 40, and the output of the frequency comparator 20 to the resistor R2 of the loop filter 40 through the switch SW2. Thus, under the synchronized state, a loop of phase comparator 11, loop filter 40 of R1 and C1, and VCO 51 is operated, and under the asynchronous state, a loop of frequency comparator 20, loop filter 40 of R2 and C1, and VCO 51 becomes operative. The average oscillation frequency of VCO 51 is controlled by the potential of capacitor C1, but it is not changed before and after the switching of the loops. In addition, since the resistor R2 is not included in the loop for synchronous state, it can be optimized only in the loop characteristic for asynchronous state. Thus, it is possible to shorten the time necessary to synchronize from the asynchronous state. In addition, even in an asynchronous state in which the frequency of the clock signal is so shifted that the phase comparator 11 erroneously operates, the loop does not include the phase comparator 11, thus preventing the synchronizing operation from being erroneous.

FIG. 6 shows a specific example of the construction of the frequency comparator 20 and asynchronous identifying unit 30 shown in FIG. 5. In this example, a second phase comparator 32 is used common to the frequency comparator 20 and synchronous identifying unit 30. In the later description, it is assumed that the clock signal is a digital binary signal, and that the frequency comparator 20 and synchronous identifying unit 30 treat not analog signals but digital signals.

Figures 7A, 7B:
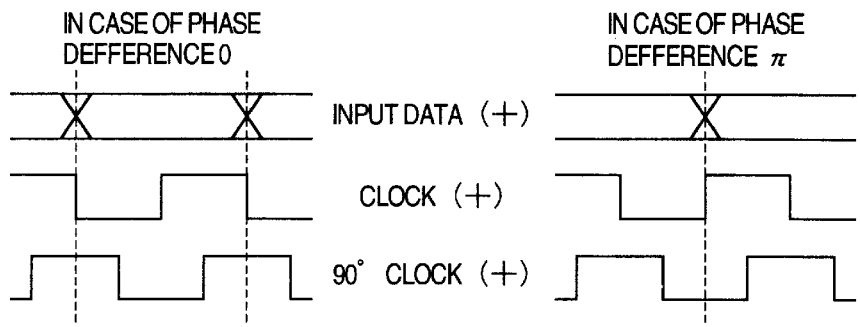
FIGS. 7A–7C timing charts to which reference is made in explaining the operation of the synchronous identifying unit and frequency comparator shown in FIGS. 5 and 6.
Figure 7C:
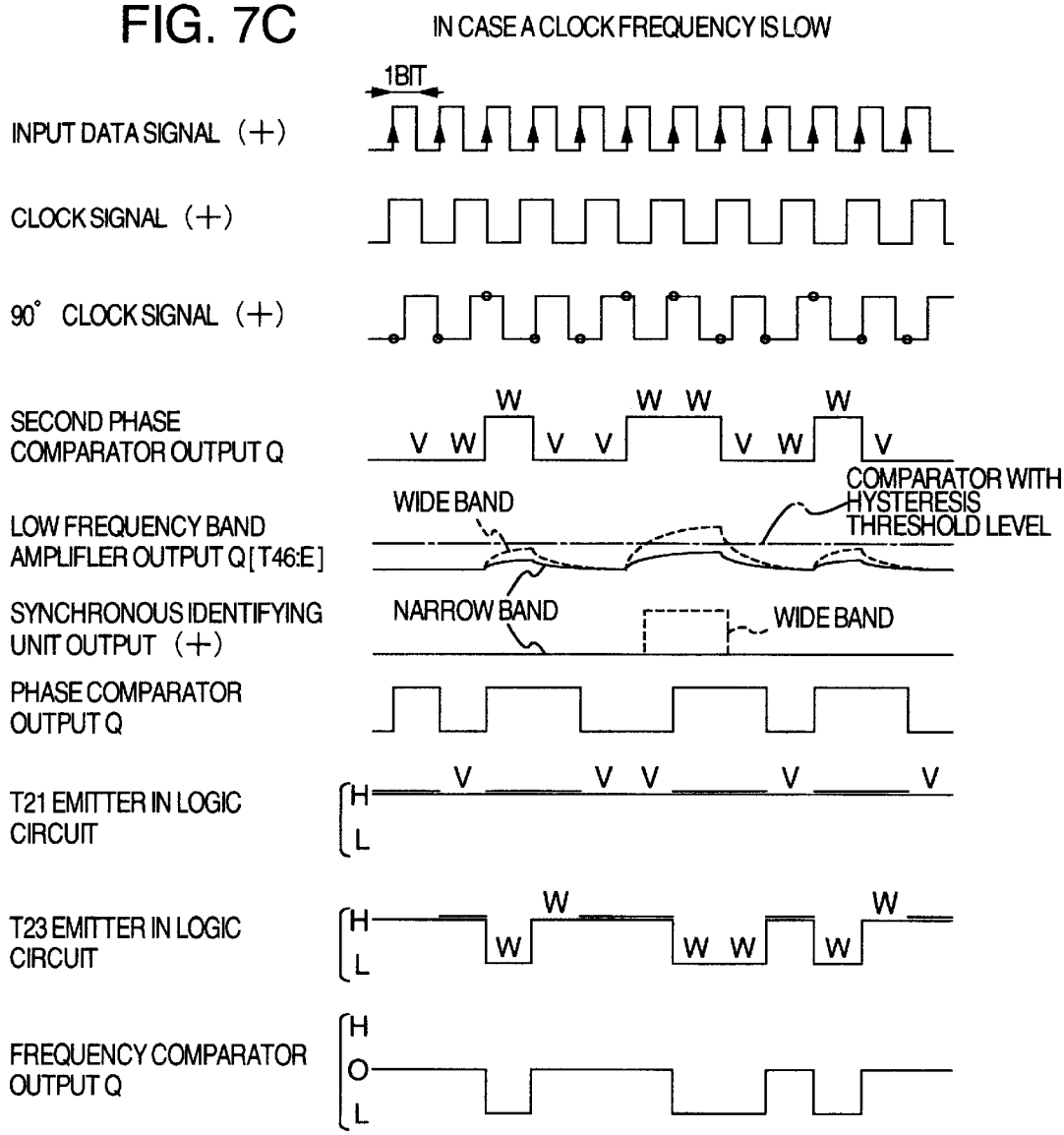

FIG. 7A is a timing chart of the input data, the clock and the 90° shifted clock, showing the state in which the input data and the clocks are synchronized. FIG. 7B is a timing chart of the input data, the clock shifted π and the clock 90° plus π shifted. FIG. 7C is a timing chart of various signals at points in the circuit arrangement in which the clock frequency is lower than the input data.

The frequency comparator 20 includes a phase comparator 21, the second comparator 32, and a logic circuit 22. The phase comparator 21 and second phase comparator 32 are flip-flop circuits in which the level of data D is held at the trailing edge of clock T. The phase comparator 21 receives the input data at its clock T of the flip-flop circuit and the clock signal at its data D of the flip-flop circuit. The input data and clock signal are assumed to have no phase difference as shown in FIG. 7A.

Thus, the phase comparator 21 generates a low-level output when the phase of the clock signal precedes –π~0 before to the trailing edge of the input data, and a high-level output when it contrarily follows 0~+π thereafter. The second phase comparator 32 receives the input data at its clock T of the flip-flop circuit and the 90° shifted clock signal at its data D of the flip-flop circuit. Thus, the phase comparator 32 generates a high-level output when the phase of the clock signal has a small phase difference of −0.5π~+0.5π relative to the trailing edge of the input data, and a low-level output when it has a large phase difference of −π~−0.5π or +0.5π~+π relative thereto.

FIG. 7C is a timing chart for the case in which the frequency of the clock signal is lower than the input data. Referring to FIG. 7C, the emitter of a transistor T21 of the logic circuit 22 receives the second phase comparator output Q at V points, and the emitter of a transistor T23 of the logic circuit 22 receives the second phase comparator output Q at VV points. The output from the frequency comparator 20 is the middle level of the output amplitude when the clock frequency cannot be decided, and the low level when the clock frequency can be decided to be lower. When the clock frequency can be decided to be higher, this output is the high level.

The synchronous identifying unit 30 is formed of the second phase comparator 32, a low-frequency band amplifier 34 and the comparator with hysteresis 35. The pulse output from the second phase comparator 32 in the timing chart of FIG. 7C changes according to the frequency difference between the input data and the clock signal. When the low-frequency band amplifier 34 has a narrow frequency band, the output waveform is as indicated by the solid line. If the threshold of the comparator with hysteresis 35 is set as indicated by the one-dot chain line, the output from the comparator 35 is always the low level during the period shown in the timing chart, thus indicating the asynchronous state. If the low-frequency band amplifier 34 has a wide frequency band, the output waveform is as indicated by the dotted line, or exceeds the threshold of the comparator 35 at a certain point. At this time, the comparator with hysteresis 35 intermittently produces the high level that indicates the synchronized state. The low-frequency band amplifier 34 has the function to prevent the synchronous identifying unit 30 from intermittently generating the output of deciding that the input data and clock are synchronized when the frequency difference between the input data and the clock signal is large. The low-frequency band amplifier 34 also has the effect to suppress the instantaneous asynchronous signal generated from the second phase comparator 32 when the input data has large jitter.

The timing chart of FIG. 7C shows the interval of time over ten periods of the input data. If the input data becomes a random pattern, the pattern may be erroneously detected. Thus, it is necessary to average the decisions of if the frequency is lower. The operation for that purpose is performed by the resistor R2 and capacitor C1 of the loop filter. If this circuit is experimentally evaluated for the random pattern of the input data, it will be found that the frequency comparator makes erroneous decision when the frequency of the clock signal exceeds around −85~+115% relative to the transmission rate of the input data. Therefore, the frequency range of the clock signal from the VCO 51 is set to be −90~+110% relative to the transmission rate of the input data.

Figure 8:
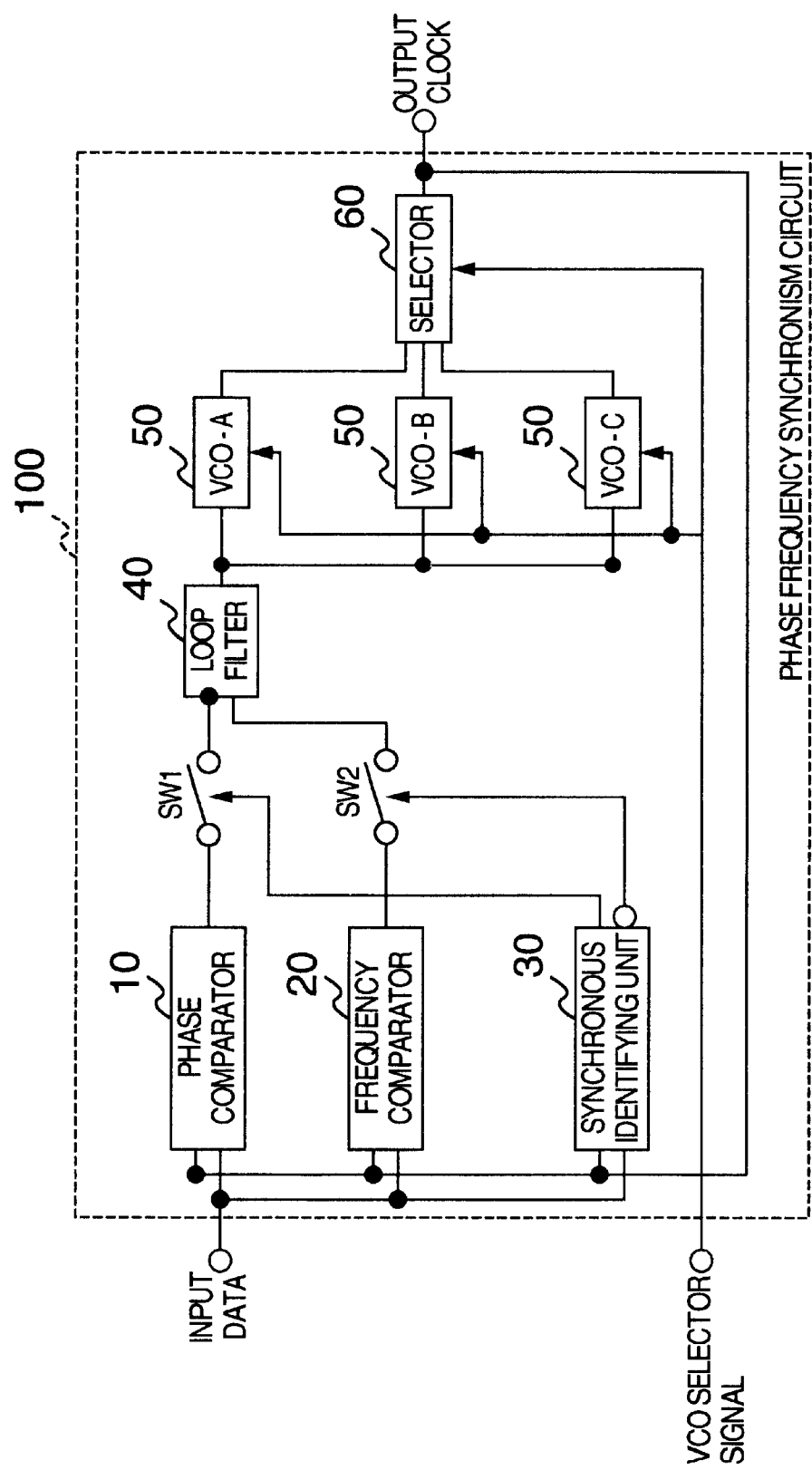
FIG. 8 is a block diagram of another embodiment of a phase frequency synchronism circuit according to the invention.

FIG. 8 is still another embodiment of a phase frequency synchronism circuit according to the invention. The voltage controlled oscillators VCO-A, VCO-B, VCO-C oscillate different clock frequencies for different input data rates. A mode selector signal is supplied to a selector 60, controlling it to select one of the oscillators, or causing only one of the oscillators to oscillate. The clock signal from the selector 60 is fed back so that a phase frequency loop is formed. The consumption currents in the VCOs not selected by the mode selector signal are 0, and thus the consumption power in this invention is not increased. According to the invention, the phase frequency synchronism circuits manufactured for several different input data rates can be combined into one unitary phase frequency synchronism circuit. This technique is suitable for the mass production of one-kind ICs. A phase frequency synchronism circuit 100 of this embodiment is capable of handling three different input data rates. According to the invention, the number of different input data rates to be treated can be determined by the number of provided VCOs of which the clock frequencies are different.

Figure 9:
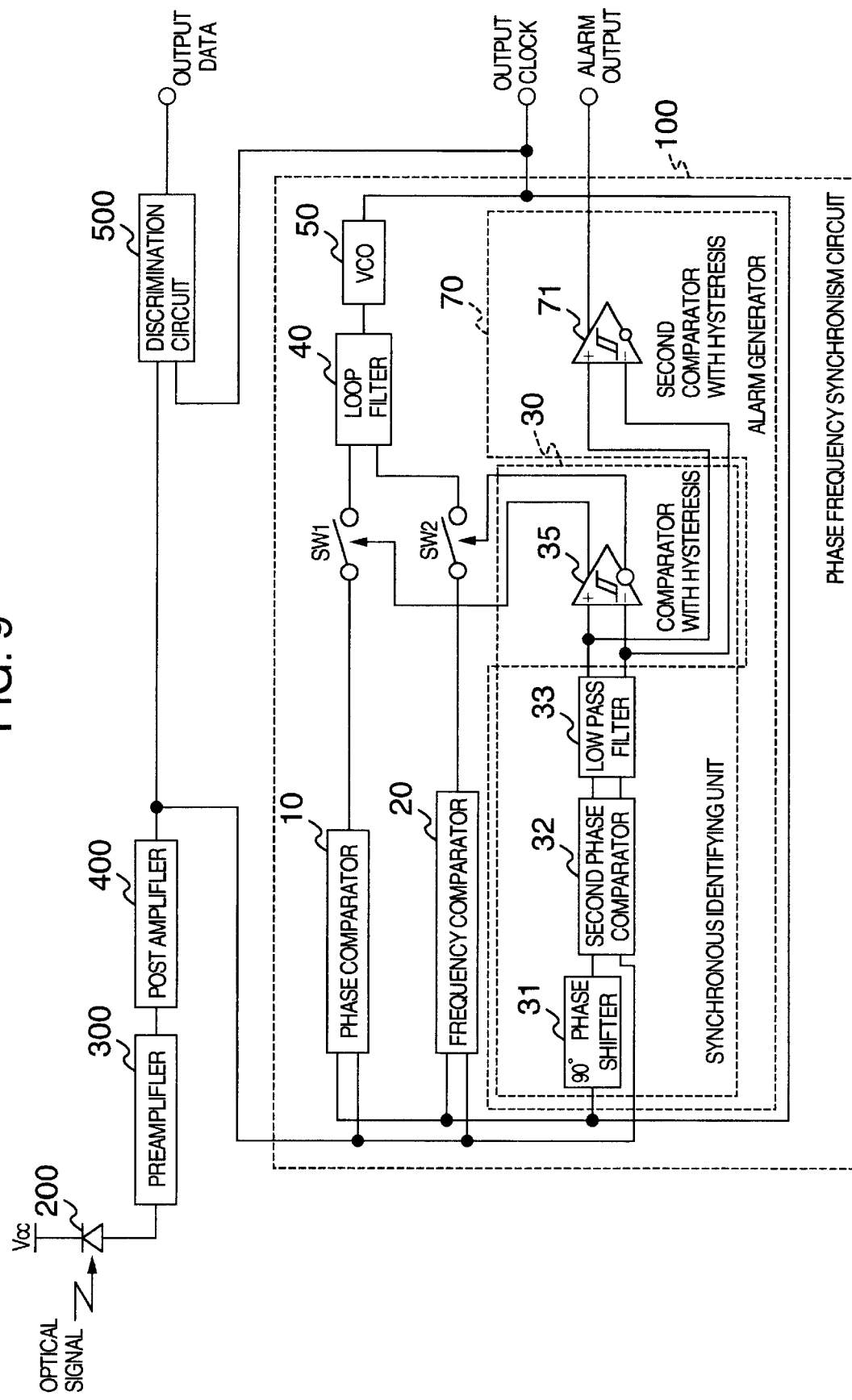
FIG. 9 is a block diagram of an optical receiver according to the invention.

FIG. 9 shows an embodiment of an optical receiver according to the invention. This optical receiver includes the phase frequency synchronism circuit 100 according to the invention, a photodetector 200, a preamplifier 300, a post-amplifier 400 and a discrimination equipment 500.

Figure 10:
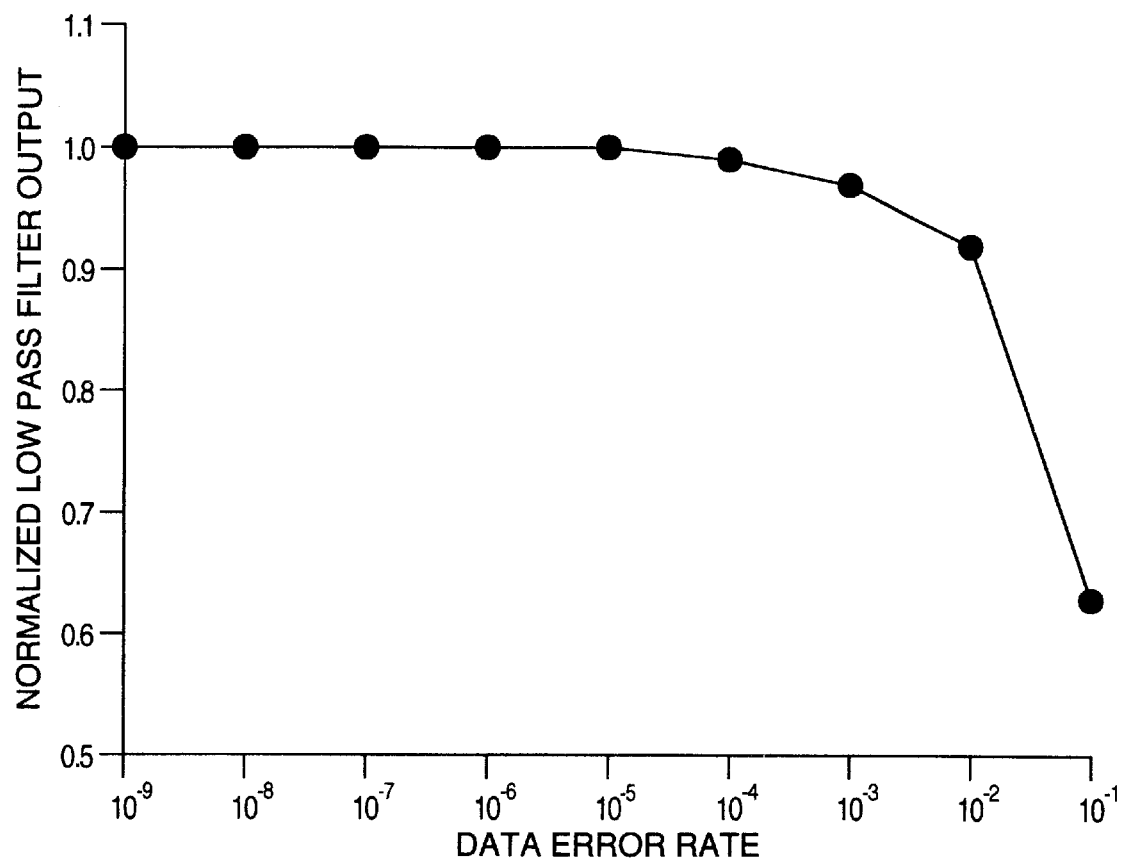
FIG. 10 is a graph showing the relation between the normalized filter output voltage of the optical receiver and the data error rate in the invention.

The output from the low pass filter 33 when the input data and the clock signal are synchronized indicates an occurrence probability to change the phase difference of the clock signal to the input data from −180° to −90° or from +90° to +180°. This occurrence probability increases with the increase of the jitter of the input data. FIG. 10 shows the calculated results of the normalized low pass filter 33 output and the data error rate estimated from the jitter of the input data.

If a threshold at which a second comparator with hysteresis 71 generated an alarm is set as a normalized value of 0.85 V of the second comparator with hysteresis, and a threshold at which the comparator stops the alarm is set as a normalized value of 0.95V of the second comparator with hysteresis, then the alarm can be generated and stopped at a data error rate of $10^{-1}$ through $10^{-3}$.

In the conventional optical receiver, the alarm was generated at a data error rate of $10^{-1}$ through $10^{-3}$ by detecting the signal power. When the optical signal is received through an optical amplifier the use of which is a feature of the recent years, the optical noise power cannot be neglected as compared with the noise power generated in the optical receiver. Thus, the alarm cannot be properly generated by the system of detecting the signal power in the optical receiver. In this embodiment with the thresholds set as above, the alarm can be generated at certain data error rates even if the optical noise power cannot be neglected as compared with the noise power generated in the optical receiver.

The construction and operation of an optical transmission system using the optical receiver according to the invention will be described below, though the diagram for this system is not shown here.

The optical transmission system is formed of a plurality of optical receivers and optical transmitters for currently used channels and maintenance channels, a switching controller for detecting a trouble within the optical fiber transmission paths and optical transmission system and ordering the main signals to be switched to proper transmission paths, and a cross connector unit that is ordered by the switching controller to change or distribute the transmission paths for the main signals. If a plurality of such optical transmission systems are combined and connected through the optical fiber transmission paths and optical amplifiers, a long distance optical communication network can be built. In this optical communication network system, if a trouble occurs in the optical transmitter and optical fiber transmission paths of the opposite optical transmission systems so that the amplified spontaneous emission optical power in the optical amplifier cannot be neglected as compared with the optical signal power, the alarm can be easily generated according to the invention in which this event can be detected from the amount of jitter relative to the signal frequency though the conventional method in which the decision is made by use of the optically received amplitude cannot properly generate the alarm. The result is that if, for example, the currently used channels have a trouble, the switching process to the maintenance channels can be properly performed.

Thus, according to the present invention as mentioned above, a phase synchronism loop is constructed by the phase comparator, filter and VCO, and for the asynchronous state a frequency synchronism loop by the frequency comparator, filter and VCO. When switching is made from the frequency synchronism loop to the phase synchronism loop, the time taken for the input data and the clock signal to be synchronized from the asynchronous state can be shortened without unstable operation of the phase frequency synchronism circuit.

In addition, according to the invention, if the input data has so large jitter as to instantaneously exceed a predetermined phase difference, although the phase frequency synchronism circuit can synchronize the input data and the clock signal by the phase frequency comparison mode, the synchronous identifying unit decides that they are synchronized, stopping the transmission of the frequency comparator output to the loop filter even if the input jitter is increased to permit the frequency comparator to instantaneously operate. Thus, the synchronizing operation can be performed by the phase frequency comparison mode with the clock jitter not instantaneously increased.

Moreover, according to the invention, if the input data is NRZ coded and has a pulse width distortion, the phase difference between the input data and clock signal detected by the phase comparator is not changed irrespective of the presence or absence of the pulse width distortion.

Also, according to the invention, when the input data and the clock signal are synchronized, the voltage across the capacitor of the loop filter formed of a series of the resistor and the capacitor can prevent the voltage developed across the resistor of the loop filter from being changed, thus making the high-frequency loop characteristic constant.

What is claimed is:

1. A phase frequency synchronism circuit comprising:
   a phase comparator that receives input data and a clock signal and generates a voltage of a peak value or pulse width according to the phase difference of said clock signal to said input data;
   a frequency comparator that receives said input data and said clock signal and decides if the frequency of said clock signal is higher or lower than the transmission rate of said input data, generating a binary signal;
   a synchronous identifying unit that receives said input data and said clock signal and decides if said input data and said clock signal are synchronized in their phases and frequencies;
   a first switch that receives the output from said phase comparator, and is closed when said synchronous identifying unit decides that said input data and said clock signal are synchronized, but opened when they are not synchronized;
   a second switch that receives the output from said frequency comparator, and is opened when said synchronous identifying unit decides that said input data and said clock signal are synchronized, but closed when they are not synchronized;
   a loop filter that receives the output from said first switch and the output from said second switch; and
   a voltage controlled oscillator for generating said clock signal with its oscillation frequency changed on the basis of the output from said loop filter.

2. A phase frequency synchronism circuit according to claim 1, wherein said synchronous identifying unit comprises:
   a 90 degree phase shifter for shifting said clock signal by 90 degrees;
   a second phase comparator that receives said input data and the output from said 90 degree phase shifter and generates a high level when the phase difference of said clock signal to said input data is in a range of −90° through +90° or a low level when the phase difference of said clock signal to said input data is in a range of −180° through −90° or +90° through +180°;
   a low pas filter that receives the output from said second phase comparator and has a certain frequency pass band; and
   a comparator with hysteresis that receives the output from said low pass filter and has a threshold set within a range of said high level through a mid point between said high level and said low level of the output from said second phase comparator, whereby when the frequency difference between the transmission rate of said input data and the frequency of said clock signal exceeds said frequency band determined by said low pass filter, said input data and said clock signal are decided not synchronized in their frequencies so that an asynchronous signal is generated from said comparator with hysteresis irrespective of the phase difference between said input data and said clock signal, and when the frequency difference between the transmission rate of said input data and the frequency of said clock signal is equal to or lower than said frequency band determined by said low pass filter, the results of comparing said input data and said clock signal on the basis of said threshold in said comparator with hysteresis are averaged by said low pass filter, in which case when an average phase difference resulting said averaged compared results is within a predetermined range, said comparator with hysteresis generates a synchronous signal, while when said average phase difference is out of said predetermined range, said comparator with hysteresis generates said asynchronous signal.

3. A phase frequency synchronism circuit according to claim 2, wherein if ftc represents a jitter transfer band of a loop formed of said phase comparator, said loop filter and said VCO when said input data and said clock signal are synchronized, said synchronous identifying unit decides that said input data and said clock signal are not synchronized in their frequencies when the frequency difference between the transmission rate of said input data and the frequency of said clock signal is equal to or larger than ftc multiplied by π.

4. A phase frequency synchronism circuit according to claim 2, wherein said phase comparator and said second phase comparator generate a voltage of a peak value or pulse width according to the phase difference of said clock signal to either leading edge or trailing edge of said input data.

5. A phase frequency synchronism circuit according to claim 3, wherein said phase comparator and said second phase comparator generate a voltage of a peak value or pulse width according to the phase difference of said clock signal to either leading edge or trailing edge of said input data.

6. A phase frequency synchronism circuit according to claim 1, wherein said phase comparator generates a current of a peak value or pulse width according to the phase difference between said input data and said clock signal.

7. A phase frequency synchronism circuit according to claim 1, wherein said voltage controlled oscillator receives the output from said loop filter, is actuated or not actuated by an externally supplied mode selector signal, and has a plurality of voltage controlled oscillators for different oscillation frequencies provided, and a selector is further provided to select one clock signal from the outputs of said plurality of voltage controlled oscillators for different oscillation frequencies in response to said mode selector signal.

8. A phase frequency synchronism circuit according to claim 2, wherein a second comparator with hysteresis having a different threshold from that of said comparator with hysteresis is further provided to receive the output from said low pass filter, and generate an alarm when jitter in said input data is larger than said threshold determined by said second comparator with hysteresis.

9. A phase frequency synchronism circuit according to claim 3, wherein a second comparator with hysteresis having a different threshold from that of said comparator with hysteresis is further provided to receive the output from said low pass filter, and generate an alarm when jitter in said input data is larger than said threshold determined by said second comparator with hysteresis.

10. A phase frequency synchronism circuit according to claim 4, wherein a second comparator with hysteresis having a different threshold from that of said comparator with hysteresis is further provided to receive the output from said low pass filter, and generate an alarm when jitter in said input data is larger than said threshold determined by said second comparator with hysteresis.

11. A phase frequency synchronism circuit according to claim 5, wherein a second comparator with hysteresis having a different threshold from that of said comparator with hysteresis is further provided to receive the output from said low pass filter, and generate an alarm when jitter in said input data is larger than said threshold determined by said second comparator with hysteresis.

12. An optical receiver comprising:

a photodetector for receiving an optical signal and converting it into an electrical signal;

an amplifier for amplifying said converted electric signal as input data;

a phase frequency synchronism circuit according to claim 8, said phase frequency synchronism circuit receiving said input data and generating said clock signal; and a discrimination equipment that receives said input data and said clock signal and discriminates said input data and said clock, said threshold of said second comparator with hysteresis relative to the jitter of said input data being set so that a data error rate is within a range of $10^{-1}$ through $10^{-3}$.

13. An optical receiver comprising:

a photodetector for receiving an optical signal and converting it into an electrical signal;

an amplifier for amplifying said converted electric signal as input data;

a phase frequency synchronism circuit according to claim 9, said phase frequency synchronism circuit receiving said input data and generating said clock signal; and a discrimination equipment that receives said input data and said clock signal and discriminates said input data and said clock, said threshold of said second comparator with hysteresis relative to the jitter of said input data being set so that a data error rate is within a range of $10^{-1}$ through $10^{-3}$.

14. An optical receiver comprising:

a photodetector for receiving an optical signal and converting it into an electrical signal:

an amplifier for amplifying said converted electric signal as input data;

a phase frequency synchronism circuit according to claim 10, said phase frequency synchronism circuit receiving said input data and generating said clock signal; and a discrimination equipment that receives said input data and said clock signal and discriminates said input data and said clock, said threshold of said second comparator with hysteresis relative to the jitter of said input data is set so that a data error rate is within a range of $10^{-1}$ through $10^{-3}$.

15. An optical receiver comprising:

a photodetector for receiving an optical signal and converting it into an electrical signal;

an amplifier for amplifying said converted electric signal as input data;

a phase frequency synchronism circuit according to claim 11, said phase frequency synchronism circuit receiving said input data and generating said clock signal; and a discrimination equipment that receives said input data and said clock signal and discriminates said input data and said clock, said threshold of said second comparator with hysteresis relative to the jitter of said input data being set so that a data error rate is within a range of $10^{-1}$ through $10^{-3}$.

16. An optical transmission system having a plurality of optical receivers according to claim 14, a plurality of optical transmitters, and a plurality of optical fibers, said optical fibers respectively connecting said optical receivers and said optical transmitters to built a plurality of optical transmission paths, wherein said alarm generated from said second comparator with hysteresis is used as one of switching information for the optical transmission paths.

17. An optical transmission system having a plurality of optical receivers according to claim 15, a plurality of optical transmitters, and a plurality of optical fibers, said optical fibers respectively connecting said optical receivers and said optical transmitters to built a plurality of optical transmission paths, wherein said alarm generated from said second comparator with hysteresis is used as one of switching information for the optical transmission paths.

* * * * *